(12) United States Patent
Moon et al.

(10) Patent No.: US 9,601,518 B2
(45) Date of Patent: Mar. 21, 2017

(54) THIN FILM TRANSISTOR DISPLAY PANEL AND METHOD FOR MANUFACTURING THE SAME

(71) Applicant: Samsung Display Co., Ltd., Yongin-si (KR)

(72) Inventors: Yeon Keon Moon, Seoul (KR); Masataka Kano, Hwaseong-si (KR); So Young Koo, Yongin-si (KR); Myoung Hwa Kim, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/856,405

(22) Filed: Sep. 16, 2015

(65) Prior Publication Data

US 2016/0300859 A1  Oct. 13, 2016

(30) Foreign Application Priority Data

Apr. 8, 2015  (KR) .......................... 10-2015-0049659

(51) Int. Cl.
*H01L 29/12* (2006.01)
*H01L 27/12* (2006.01)
(Continued)

(52) U.S. Cl.
CPC ........ *H01L 27/1225* (2013.01); *H01L 27/124* (2013.01); *H01L 27/127* (2013.01);
(Continued)

(58) Field of Classification Search
CPC ........... H01L 29/7869; H01L 29/66969; H01L 27/1225; H01L 29/42384; H01L 29/786;
(Continued)

(56) References Cited

U.S. PATENT DOCUMENTS

2010/0193783 A1* 8/2010 Yamazaki ............. G02F 1/1362
257/43
2012/0007158 A1 1/2012 Yoon et al.
(Continued)

FOREIGN PATENT DOCUMENTS

| KR | 10-1997-0054334 | 7/1997 |
| KR | 10-2009-0025703 | 3/2009 |
| KR | 10-2012-0134758 | 12/2012 |

OTHER PUBLICATIONS

Baek et al., Electrical Instability of Double-Gate a-IGZO TFTs With Metal Source/Drain Recessed Electrodes, IEEE Transactions on Electron Devices, Apr. 2014, p. 1109-1115, vol. 61, No. 4.
(Continued)

*Primary Examiner* — Robert Bachner
(74) *Attorney, Agent, or Firm* — H.C. Park & Associates, PLC

(57) ABSTRACT

A thin film transistor display panel including: a first insulating substrate; a first semiconductor disposed between the first insulating substrate and a first gate insulating layer; a gate electrode disposed on the first gate insulating layer, the gate electrode overlapping the first semiconductor; a second gate insulating layer disposed on the gate electrode; a second semiconductor disposed on the second gate insulating layer, the second semiconductor overlapping the gate electrode; an interlayer insulating layer disposed on the second semiconductor; and a source electrode and a drain electrode disposed on the interlayer insulating layer spaced apart from each other, the source electrode and the drain electrode connected to the first semiconductor and the second semiconductor.

10 Claims, 13 Drawing Sheets

(51) Int. Cl.
    *H01L 29/786*     (2006.01)
    *H01L 29/66*     (2006.01)
    *H01L 29/423*     (2006.01)

(52) U.S. Cl.
    CPC .... *H01L 27/1251* (2013.01); *H01L 29/42356* (2013.01); *H01L 29/42384* (2013.01); *H01L 29/66969* (2013.01); *H01L 29/7869* (2013.01); *H01L 29/78603* (2013.01); *H01L 29/78648* (2013.01)

(58) Field of Classification Search
    CPC ..... H01L 21/02565; H01L 2224/48091; H01L 27/124; H01L 27/1222; H01L 29/78693; H01L 2029/42388; H01L 21/02554
    See application file for complete search history.

(56) References Cited

U.S. PATENT DOCUMENTS

| | | | | |
|---|---|---|---|---|
| 2012/0211753 | A1* | 8/2012 | Kim | H01L 27/1288 257/59 |
| 2013/0306965 | A1* | 11/2013 | Ahn | H01L 29/78693 257/43 |
| 2013/0328045 | A1 | 12/2013 | Takata et al. | |
| 2014/0186998 | A1 | 7/2014 | Koezuka et al. | |
| 2015/0123134 | A1* | 5/2015 | Wang | H01L 27/14649 257/72 |

OTHER PUBLICATIONS

Hisamoto et al., FinFET—A Self-Aligned Double-Gate MOSFET Scalable to 20 nm, IEEE Transactions on Electron Devices, Dec. 2000, p. 2320-2325, vol. 47, No. 12.

\* cited by examiner

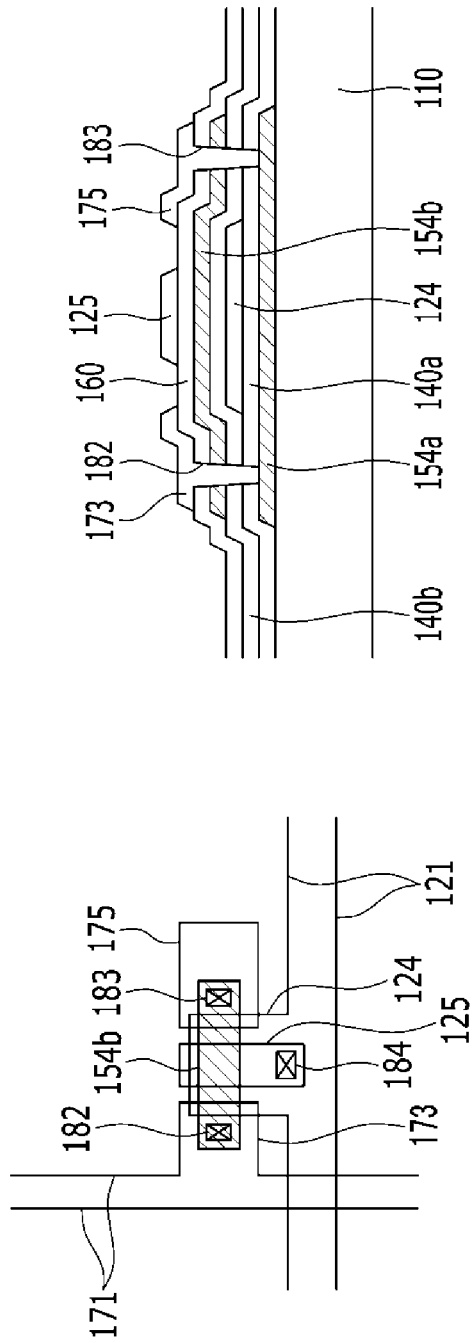

THIN FILM TRANSISTOR DISPLAY PANEL AND METHOD FOR MANUFACTURING THE SAME

CROSS-REFERENCE TO RELATED APPLICATION

This application claims priority from and the benefit of Korean Patent Application No. 10-2015-0049659, filed on Apr. 8, 2015, which is hereby incorporated by reference for all purposes as if fully set forth herein.

BACKGROUND

Field

Exemplary embodiments relate to a thin film transistor display panel and a method for manufacturing the same.

Discussion of the Background

Thin film transistors (TFTs) have been widely used in various electronic devices, such as flat panel display devices. For example, the thin film transistor is used as a switching element or a driving element in a flat panel display, such as a liquid crystal display (LCD), an organic light emitting diode (OLED) display, and an electrophoretic display.

The thin film transistor includes a gate electrode connected to a gate line to transmit a scanning signal, a source electrode connected to a data line to transmit a signal applied to a pixel electrode, a drain electrode facing the source electrode, and a semiconductor electrically connected to the source electrode and the drain electrode.

Among them, the semiconductor is a critical element in determining characteristics of the thin film transistor. Silicon (Si) is the most widely used semiconductor. Silicon may be classified as an amorphous silicon or a polysilicon according to its crystallization type. Although the amorphous silicon may be made by a simpler manufacturing process, such amorphous silicon may have limitations when applied as a high performance thin film transistor due to its low charge mobility. On the other hand, manufacturing polysilicon having high charge mobility generally includes a crystallizing process, and therefore, manufacturing cost may be increased and the process may become complicated.

To address the deficiencies of amorphous silicon and polysilicon, research has been made on a thin film transistor using an oxide semiconductor which has higher electron mobility and a higher ON/OFF ratio compared to amorphous silicon, and a higher uniformity and a lower manufacturing cost compared to polysilicon.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a thin film transistor including an oxide semiconductor and having improved characteristics.

Additional aspects will be set forth in the detailed description which follows, and, in part, will be apparent from the disclosure, or may be learned by practice of the inventive concept.

An exemplary embodiment provides a thin film transistor display panel including: a first insulating substrate; a first semiconductor disposed between the first insulating substrate and a first gate insulating layer; a gate electrode disposed on the first gate insulating layer, the gate electrode overlapping the first semiconductor; a second gate insulating layer disposed on the gate electrode; a second semiconductor disposed on the second gate insulating layer, the second semiconductor overlapping the gate electrode; an interlayer insulating layer disposed on the second semiconductor; and a source electrode and a drain electrode disposed on the interlayer insulating layer spaced apart from each other, the source electrode and the drain electrode connected to the first semiconductor and the second semiconductor.

The first gate insulating layer, the second gate insulating layer, the second semiconductor, and the interlayer insulating layer may include a first contact hole and a second contact hole.

The source electrode is electrically connected to the first semiconductor and the second semiconductor through the first contact hole, and the drain electrode is electrically connected to the first semiconductor and the second semiconductor through the second contact hole.

An upper gate electrode may be further formed on the interlayer insulating layer.

The upper gate electrode may be made of a same material and formed in a same layer as the source electrode and the drain electrode.

The second gate insulating layer and the interlayer insulating layer may have a third contact hole.

The gate line and the upper gate electrode may be electrically connected through the third contact hole.

An exemplary embodiment also provides a method for manufacturing a thin film transistor display panel including: disposing a first semiconductor on a first insulating substrate; disposing a first gate insulating layer on the first semiconductor; disposing a gate line including a gate electrode overlapping the first semiconductor disposed on the first gate insulating layer; disposing a second gate insulating layer on the gate line; disposing a second semiconductor overlapping the gate electrode disposed on the second gate insulating layer; disposing an interlayer insulating layer on the second semiconductor; and disposing a data line including a source electrode and a drain electrode on the interlayer insulating layer.

The first gate insulating layer, the second gate insulating layer, the second semiconductor, and the interlayer insulating layer may include a first contact hole and a second contact hole.

The source electrode is electrically connected to the first semiconductor and the second semiconductor through the first contact hole, and the drain electrode is electrically connected to the first semiconductor and the second semiconductor through the second contact hole.

An upper gate electrode may be further formed on the interlayer insulating layer.

The upper gate electrode may be made of a same material and formed in a same layer as the source electrode and the drain electrode.

The second gate insulating layer and the interlayer insulating layer may have a third contact hole.

The gate line and the upper gate electrode may be electrically connected through the third contact hole.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 5A, FIG. 6A, FIG. 7A, FIG. 8A, and FIG. 9A are top plan views sequentially showing an exemplary method for manufacturing a thin film transistor display panel according to the exemplary embodiments. FIG. 5B, FIG. 6B, FIG. 7B, FIG. 8B, and FIG. 9B are cross-sectional views sequentially showing an exemplary method for manufacturing a thin film transistor display panel according to the exemplary embodiments.

DETAILED DESCRIPTION OF THE ILLUSTRATED EMBODIMENTS

Figure 1:
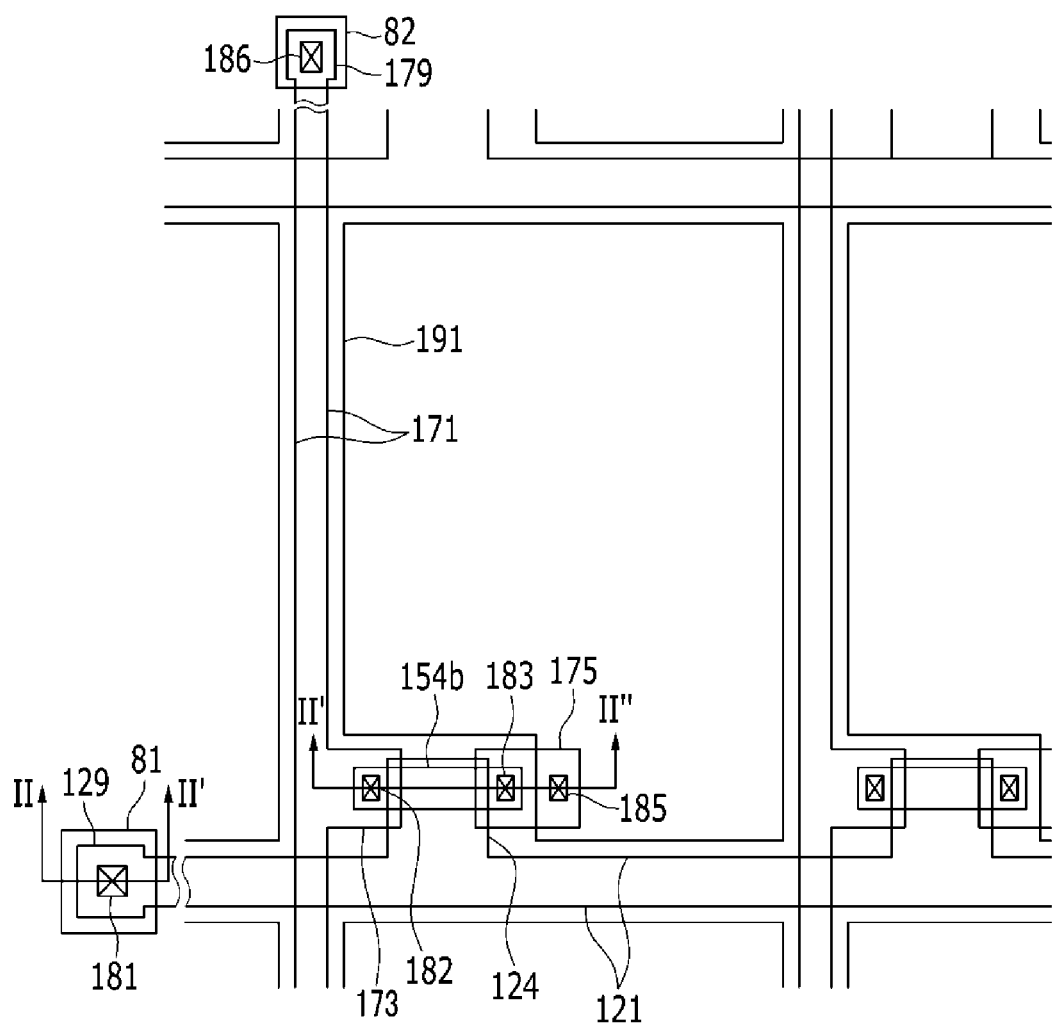
FIG. 1 is a top plan view of a liquid crystal display panel according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
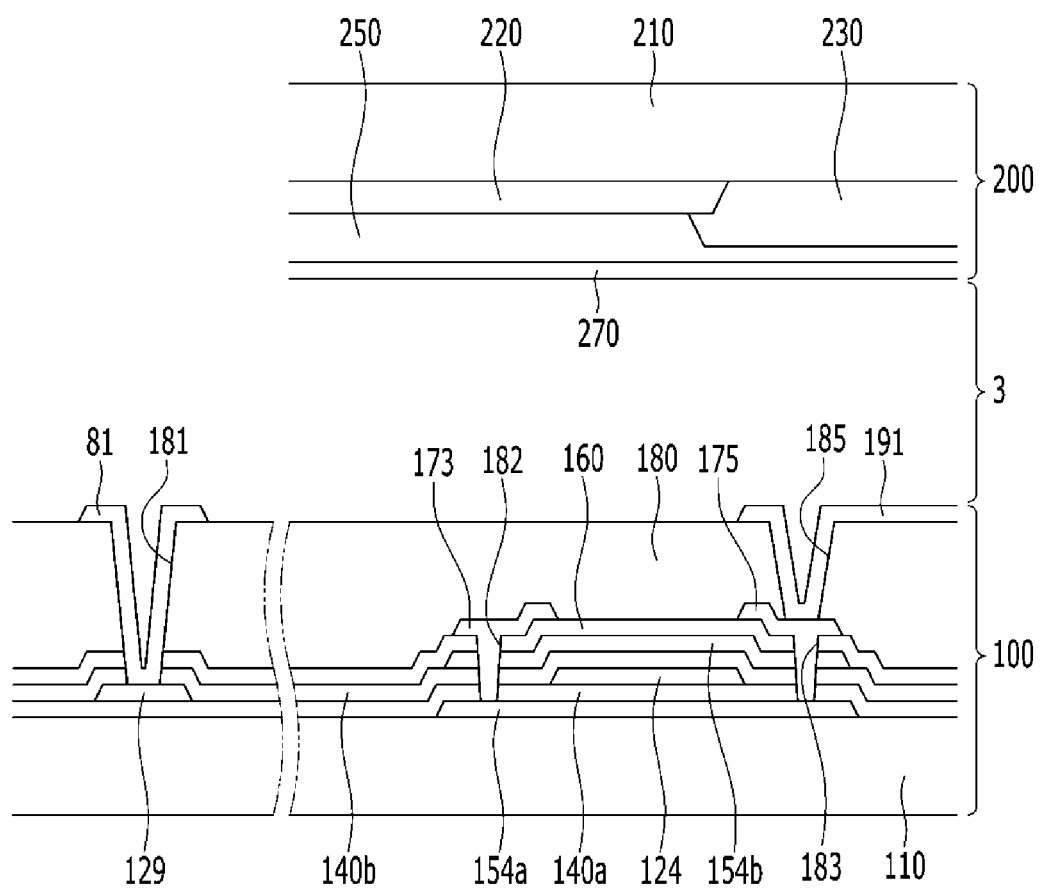
FIG. 2 is a cross-sectional view taken along sectional lines II-II' and II'-II" of the liquid crystal display panel of FIG. 1.

FIG. 1 is a top plan view of a liquid crystal display panel according to an exemplary embodiment, and FIG. 2 is a cross-sectional view taken along sectional lines II-II' and II'-II" of the liquid crystal display panel of FIG. 1.

Referring to FIG. 1 and FIG. 2, a liquid crystal display device according to an exemplary embodiment includes a thin film transistor display panel 100, an upper display panel 200, and a liquid crystal layer 3 interposed between the two display panels 100, 200.

At first, the thin film transistor display panel 100 will be described.

Referring to FIG. 1 and FIG. 2, the thin film transistor display panel 100 includes a first semiconductor 154a, a gate electrode 124, a second semiconductor 154b, a source electrode 173, and a drain electrode 175 disposed on a first insulating substrate 110.

The first insulating substrate 110 may be a transparent insulating substrate made of at least one of a glass, a quartz, a ceramic, a plastic and the like, and/or may be a metallic substrate made of at least one of a stainless steel and the like.

The first semiconductor 154a is disposed on the first insulating substrate 110.

The first semiconductor 154a may be divided into a channel region, and a source region and a drain region disposed at respective sides of the channel region. A channel is formed in the channel region which is disposed between the source electrode and the drain electrode.

The first semiconductor 154a may be made of polysilicon (poly-Si) or oxide semiconductor. The oxide semiconductor may include an oxide including at least one of titanium (Ti), hafnium (Hf), zirconium (Zr), aluminum (Al), tantalum (Ta), germanium (Ge), zinc (Zn), gallium (Ga), tin (Sn), and indium (In), and/or a composite oxide including at least one of zinc oxide (ZnO), indium-gallium-zinc oxide (In-GaZnO4), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium- tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

A first gate insulating layer 140a is disposed on the first semiconductor 154a.

The first gate insulating layer 140a may include an insulating material including at least one of tetra ethyl ortho silicate (TEOS), silicon oxide ($SiO_x$), silicon nitride ($SiN_x$), and silicon oxynitride (SiON). The first gate insulating layer 140a may be made of the insulating material containing abundant nitrogen so as to inhibit or prevent the first semiconductor 154a adjacent to the first gate insulating layer 140a from reacting with oxygen and deteriorating its characteristics.

Referring to FIG. 1, a plurality of gate lines 121 extending in a first direction and a plurality of data lines 171 extending in a second direction crossing the first direction are disposed on the first gate insulating layer 140a. Pixels may be defined by the gate lines 121 and data lines 171 on the first insulating substrate 110. However, the pixels may also be defined in various other ways.

The gate line 121 transmits a gate signal and is mainly extended in a substantially horizontal direction. Each of the gate lines 121 includes a plurality of gate electrodes 124 protruded from a stem of the gate line and a gate pad 129 which is a broad end part to contact another layer or a gate driver (not shown).

The gate electrode 124 is disposed on the first gate insulating layer 140a overlapping the first semiconductor 154a. The gate electrode 124 may be formed of the same metal as the gate line 121. The gate electrode 124 may have multilayer structure including at least two conductive layers with different physical and/or chemical properties, for example, a triple layer such as Ti/Cu/Ti, Ti/Ag/Ti, and Mo/Al/Mo.

A second gate insulating layer 140b is disposed on the gate electrode 124. The second gate insulating layer 140b may include an insulating material including at least one of tetra ethyl ortho silicate (TEOS), silicon oxide ($SiO_x$), silicon nitride ($SiN_x$), and silicon oxynitride (SiON).

The second semiconductor 154b is disposed on the second gate insulating layer 140b overlapping the gate electrode 124. The second semiconductor 154b may be divided into a channel region and a source region and a drain region disposed at both sides of the channel region. A channel is formed in the channel region, which is disposed between the source electrode and the drain electrode.

The second semiconductor 154b may be made of the same material as the first semiconductor 154a. In other words, the second semiconductor 154b may be made of polysilicon (poly-Si) and/or oxide semiconductor.

The interlayer insulating layer 160 is disposed on the second semiconductor 154b to protect the second semiconductor 154b. The interlayer insulating layer 160 may include an insulating material including at least one of tetra ethyl ortho silicate (TEOS), silicon oxide ($SiO_x$), silicon nitride ($SiN_x$), and silicon oxynitride (SiON).

Each of the first gate insulating layer 140a, the second gate insulating layer 140b, the second semiconductor 154b, and the interlayer insulating layer 160 includes a first contact hole 182 and a second contact hole 183. The source region in the first semiconductor 154a is exposed by the first contact hole 182, and the drain region in the first semiconductor 154a is exposed by the second contact hole 183.

A plurality of data lines 171, a plurality of source electrodes 173 connected to the plurality of data lines 171, and a plurality of drain electrodes 175 facing the source electrodes 173 are disposed on the interlayer insulating layer 160.

The data line 171 is configured to transfer a data signal, and mainly extends in a substantially vertical direction crossing the gate line 121. The source electrode 173 is protruded toward the gate electrode 124. The drain electrode 175 is separated from the data line 171 and disposed facing the source electrode 173.

The data line 171 includes a data pad 179 to contact other layers or a data driver (not shown).

The data line 171, the source electrode 173, and the drain electrode 175 may be made of aluminum-based metal such as aluminum (Al) and aluminum alloy, silver-based metal such as silver (Ag) and silver alloy, copper-based metal such as copper (Cu) and copper alloy, molybdenum-based metal such as molybdenum (Mo) and molybdenum alloy, chromium (Cr), tantalum (Ta), titanium (Ti), and/or the like.

The source electrode 173 is connected to the first semiconductor 154a and the second semiconductor 154b through the first contact hole 182. The drain electrode 175 is connected to the first semiconductor 154a and the second semiconductor 154b through the second contact hole 183.

Characteristics of the thin film display panel 100 according to an exemplary embodiment may be improved by forming two channel regions by the gate signal applied to the gate electrode 124, one in the first semiconductor 154*a* and the other in the second semiconductor 154*b*, compared to the conventional thin film transistor display panel of which each thin film transistor includes merely one channel region.

A protective layer 180 is disposed on the data line 171, the source electrode 173, and the drain electrode 175. The protective layer 180 may be made of an inorganic insulator such as silicon nitride and/or silicon oxide, an organic insulator, and an insulator with low dielectric constant.

Each of the protective layer 180, the second gate insulating layer 140*b* and the interlayer insulating layer 160 includes a contact hole 181 exposing the gate pad 129. Also, the protective layer 180 includes a contact hole 186 exposing the data pad 179 of the data line 171 and a contact hole 185 exposing an end of the drain electrode 175.

A pixel electrode 191 and contact assisting members 81 and 82 are disposed on the protective layer 180. They may be made of a transparent conductive material including at least one of indium tin oxide ITO and indium zinc oxide IZO, and/or a reflective material including at least one of aluminum, silver, chromium, and their alloys.

The pixel electrode 191 is physically and electrically connected to the drain electrode 175 through the contact hole 185, and receives a data voltage from the drain electrode 175.

The contact assisting members 81 and 82 are connected to an end part (gate pad, 129) of the gate line 121 and an end part (data pad, 179) of the data line 171 through each of contact holes 181 and 186 respectively. The contact assisting members 81 and 82 promote adhesive strength between an external device and the gate pad 129 of the gate line 121 and the data pad 179 of the data line 171 and protect them.

Next, referring to FIG. 2, the upper display panel 200 will be described.

A light blocking member 220 is disposed on a second insulating substrate 210 which is made of at least one of a transparent glass, a plastic, and the like. The light blocking member 220 prevents light leakage between the pixel electrodes 191 and defines an opening region facing the pixel electrode 191.

A plurality of color filters 230 are disposed on the second insulating substrate 210, and the light blocking member 220. The color filter 230 is mainly disposed in the region surrounded by the light blocking member 220, and may be elongated to extend along a column direction of the pixel electrode 191. Each of the color filters 230 displays one of the primary colors, such as the three primary colors of red, green, and blue.

Although the light blocking member 220 and the color filter 230 are disposed on the upper display panel 220 in this exemplary embodiment, the exemplary embodiments at least one of the light blocking member 220 and the color filter 230 may be disposed on the thin film transistor display panel 100.

An overcoat 250 is disposed on the color filter 230 and the light blocking member 220. The overcoat 250 may be made of an organic insulator. The overcoat 250 may inhibit or prevent the color filter 230 from being exposed, and provide a flat surface. The overcoat 250 may be omitted.

A common electrode 270 is disposed on the overcoat 250. The common electrode 270 is made of a transparent conductor such as ITO and IZO, and may be applied with a common voltage (Vcom).

The liquid crystal layer 3 interposed between the thin film transistor display panel 100 and the upper display panel 200 may include a liquid crystal material which has negative dielectric anisotropy. Liquid crystal molecules in the liquid crystal material are aligned so that their axes are perpendicular to surfaces of the two display panels 100, 200 in absent of any electric field.

The pixel electrode 191 and the common electrode 270 form a liquid crystal capacitor with the liquid crystal layer 3 disposed therebetween, and thereby maintaining the applied voltage even after the thin film transistor is turned off.

The pixel electrode 191 may form a storage capacitor by overlapping a storage electrode line (not shown), thereby increasing voltage maintaining capacity of the liquid crystal capacitor.

Figure 3:
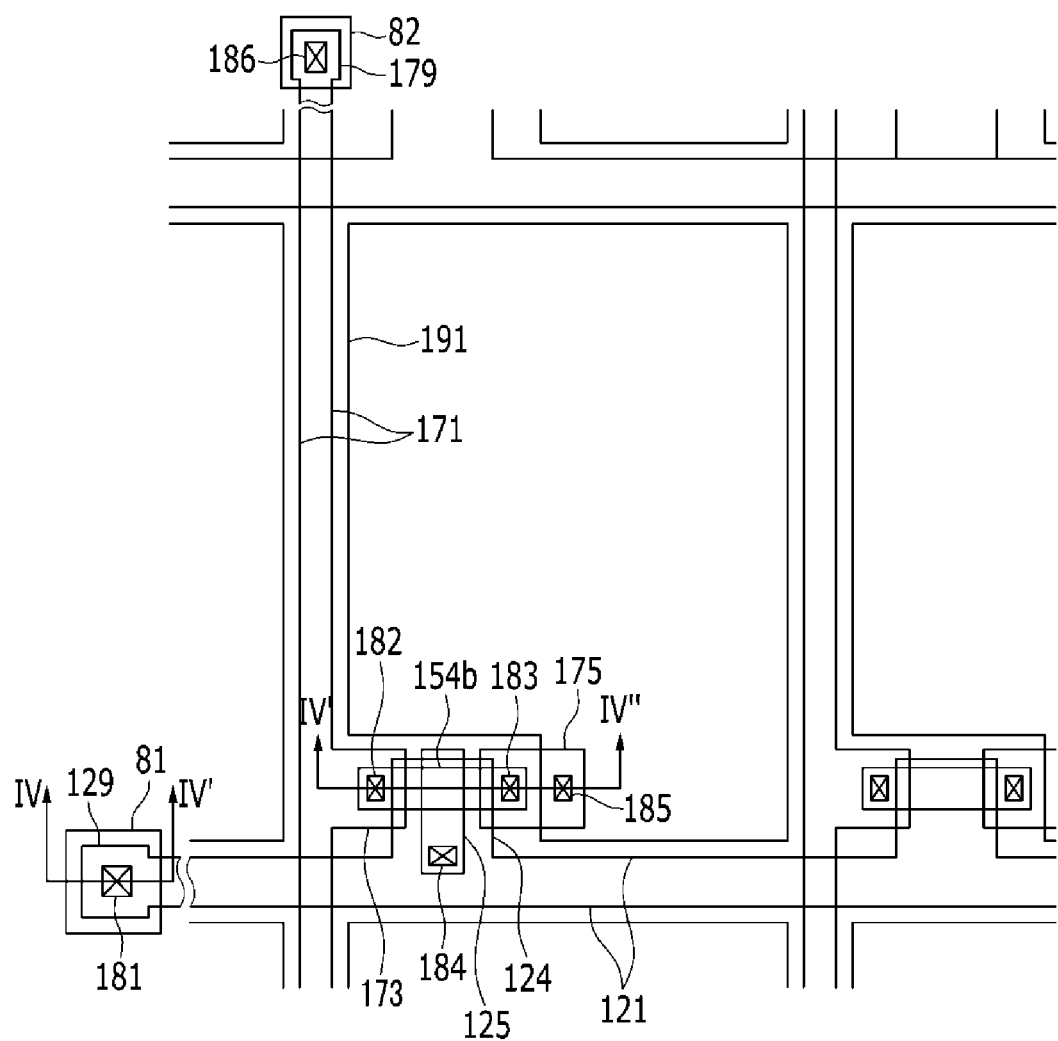
FIG. 3 is a top plan view of a liquid crystal display panel according to an exemplary embodiment.
Figure 4:
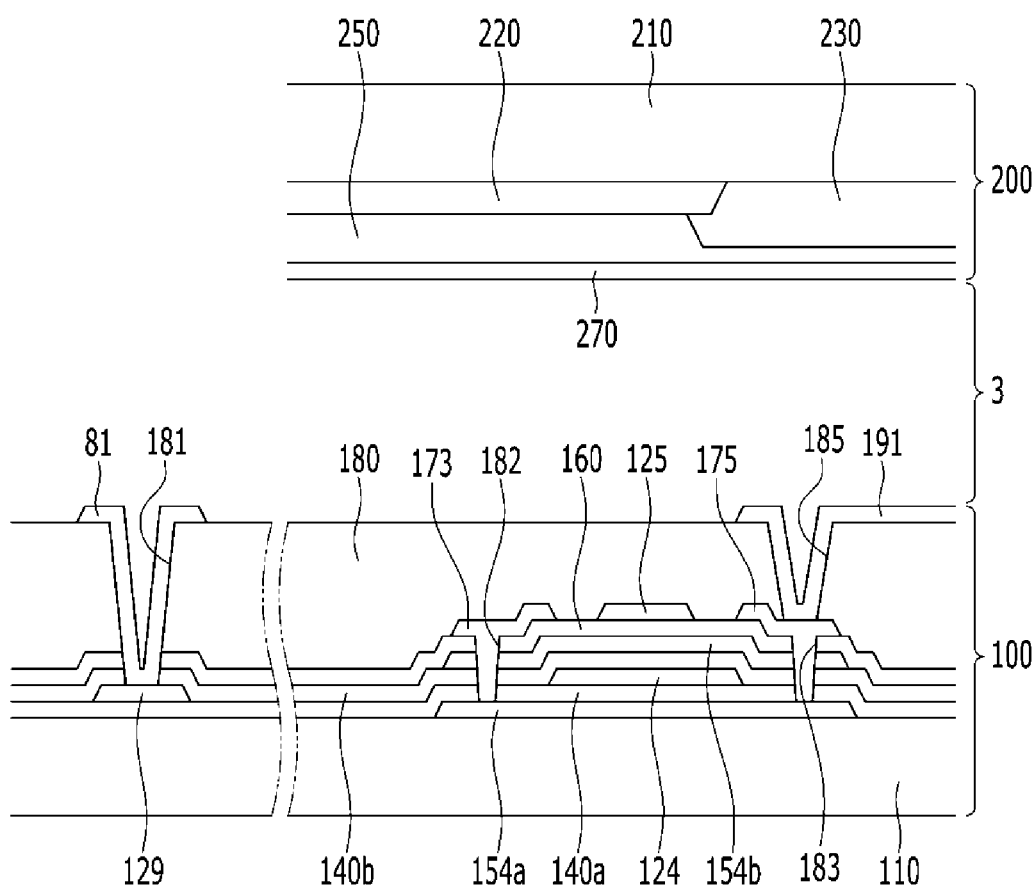
FIG. 4 is a cross-sectional view taken along sectional lines IV-IV' and IV'-IV" of liquid crystal display panel of FIG. 3.

Referring to FIG. 3 and FIG. 4, the thin film transistor display panel according to an exemplary embodiment will be described.

FIG. 3 is a top plan view of a thin film transistor display panel according to an exemplary embodiment, and FIG. 4 is a cross-sectional view taken along sectional lines IV-IV' and IV'-IV'' of the thin film transistor display panel of FIG. 3. The thin film transistor display panel of FIG. 4 is the same as those of FIG. 1 and FIG. 2, except that the thin film transistor display panel of FIG. 4 further includes an upper gate electrode 125. Thus, the same reference numbers denote same configurations, and repetitive description of the same configuration will be omitted.

Referring to FIG. 3 and FIG. 4, the thin film transistor display panel 100 according to an exemplary embodiment includes the first semiconductor 154*a*, the first gate insulating layer 140*a*, the gate electrode 124, the second gate insulating layer 140*b*, the second semiconductor 154*b*, the interlayer insulating layer 160, the source electrode 173, the drain electrode 175, and the upper gate electrode 125, disposed on the first insulating substrate 110.

The source electrode 173, the drain electrode 175, and the upper gate electrode 125 are disposed on the interlayer insulating layer 160.

The upper gate electrode 125 may be disposed between the source electrode 173 and the drain electrode 175 which are spaced apart from each other on the interlayer insulating layer 160.

The upper gate electrode 125 may be made of the same material as the source electrode 173 and the drain electrode 175. In other words, the upper gate electrode 125 may be made of aluminum-based metal such as aluminum (Al) and aluminum alloy, silver-based metal such as silver (Ag) and silver alloy, copper-based metal such as copper (Cu) and copper alloy, molybdenum-based metal such as molybdenum (Mo) and molybdenum alloy, chromium (Cr), tantalum (Ta), titanium (Ti), and/or the like.

The upper gate electrode 125 is physically and electrically connected to the gate electrode 124 through a third contact hole 184 which penetrates the second gate insulating layer 140*b* and the interlayer insulating layer 160.

Characteristics of the thin film transistor display panel according to an exemplary embodiment may be further improved because one more channel region is formed in the second semiconductor 154*b* by the gate signal applied to the upper gate electrode 125, compared to two channel regions such as one in the first semiconductor 154*a* and the other in the second semiconductor 154*b*, which are formed by the gate signal applied to the gate electrode 124.

FIG. 5A, FIG. 6A, FIG. 7A, FIG. 8A, and FIG. 9A are top plan views sequentially showing an exemplary method for manufacturing a thin film transistor display panel according to the exemplary embodiments. FIG. 5B, FIG. 6B, FIG. 7B, FIG. 8B, and FIG. 9B are cross-sectional views sequentially showing an exemplary method for manufacturing a thin film transistor display panel according to the exemplary embodiments. The repetitive description of the same configuration and structure as those in the above described exemplary embodiment will be omitted.

Figure 5A:
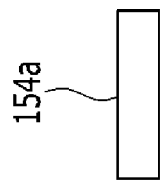
Figure 5B:
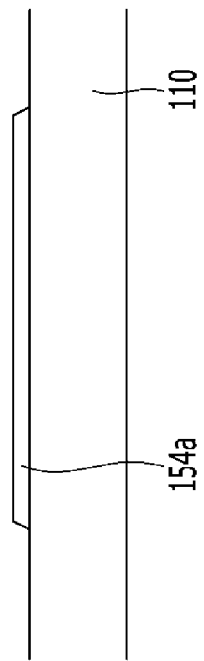

Referring to FIG. 5A and FIG. 5B, the first semiconductor 154a is disposed on the first insulating substrate 110. The first semiconductor 154a is formed on the first insulating substrate 110 by depositing an amorphous oxide semiconductor such as an indium gallium zinc oxide IGZO using a sputtering method or a metal organic chemical vapor deposition (MOCVD) method, crystallizing the amorphous oxide semiconductor by performing a high temperature heat treatment process of at least 650° C. through a furnace heating or a rapid thermal process (RTP), and patterning the crystallized oxide semiconductor through a mask process.

Figure 6A:
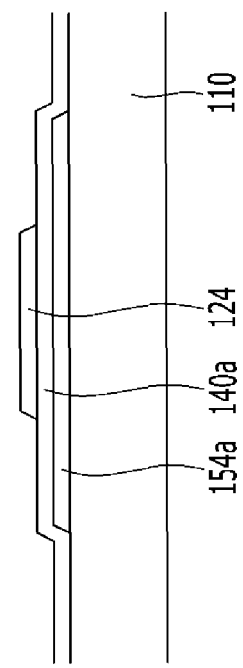
Figure 6B:
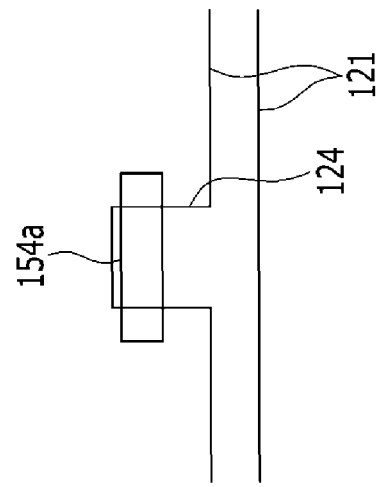

Referring to FIG. 6A and FIG. 6B, the first gate insulating layer 140a is disposed on the first semiconductor 154a by a chemical vapor deposition (CVD) method. The first gate insulating layer 140a is formed by supplying a silane gas ($SiH_4$), a hydrogen gas ($H_2$), ammonia gas ($NH_3$) or the like into a CVD chamber.

On the first gate insulating layer 140a, the gate line 121 including the gate electrode 124 is disposed overlapping the first semiconductor 154a and the gate pad 129. The gate electrode 124 may have a multilayer structure including at least two conductive layers having different physical and/or chemical properties, for example, a triple layer, such as Ti/Cu/Ti, Ti/Ag/Ti, and Mo/Al/Mo.

Figure 7A:
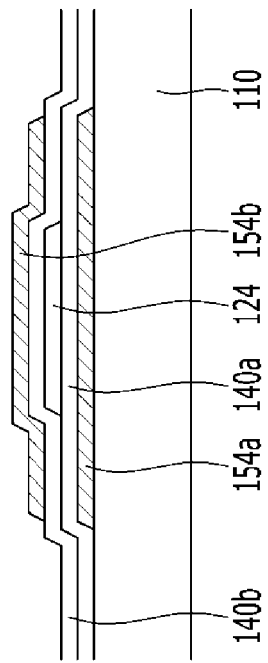
Figure 7B:
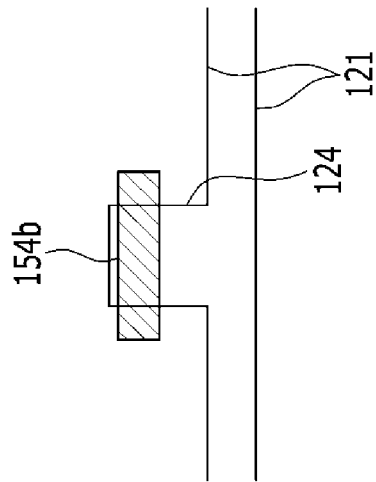

Referring to FIG. 7A and FIG. 7B, the second gate insulating layer 140b is disposed on the gate line 121 by a chemical vapor deposition (CVD) method. The second gate insulating layer 140b is formed by supplying a silane gas ($SiH_4$), a hydrogen gas ($H_2$), ammonia gas ($NH_3$) or the like in a CVD chamber.

Next, the second semiconductor 154b is disposed on the second gate insulating layer 140b overlapping the gate electrode 124. The second semiconductor 154b is formed on the second insulating substrate 140b by depositing an amorphous oxide semiconductor such as a-IGZO using a sputtering method or a metal organic chemical vapor deposition (MOCVD) method, crystallizing the amorphous oxide semiconductor by performing a high temperature heat treatment process of at least 650° C. through a furnace heating or a rapid thermal process (RTP), and patterning the crystallized oxide semiconductor through a mask process.

Figure 8A:
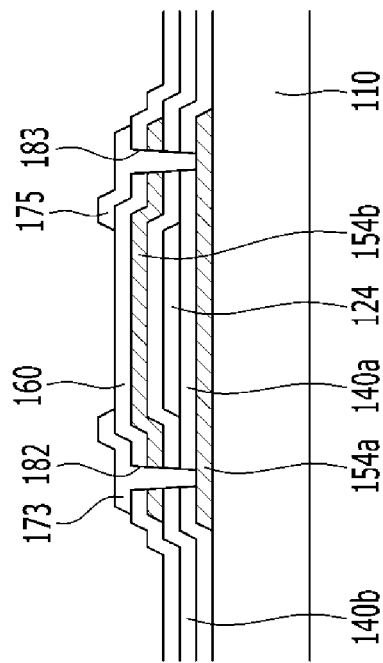
Figure 8B:
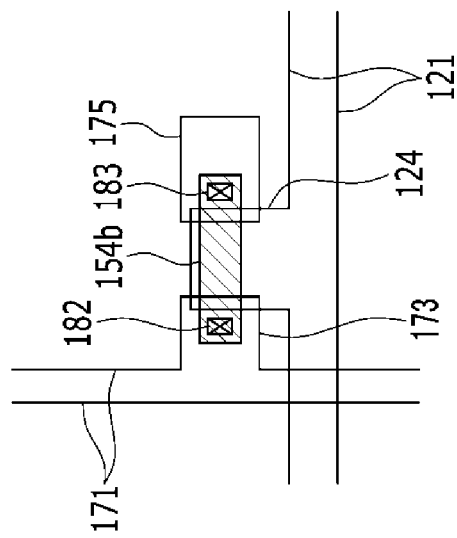

Referring to FIG. 8A and FIG. 8B, the interlayer insulating layer 160 is disposed on the second semiconductor 154b by a chemical vapor deposition (CVD) method. Next, the first contact hole 182 and the second contact hole 183 are formed in the first gate insulating layer 140a, the second gate insulating layer 140b, the second semiconductor 154b, and the interlayer insulating layer 160 so as to expose a portion of the first semiconductor 154a.

The data line 171 including the source electrode 173 and the drain electrode 175 is formed by a photolithography process. The source electrode 173 is electrically connected to the first semiconductor 154a and the second semiconductor 154b through the first contact hole 182, and the drain electrode 175 is electrically connected to the first semiconductor 154a and the second semiconductor 154b through the second contact hole 183. The drain electrode 175 is spaced apart from the source electrode 173 and is positioned in the opposite side of the source electrode 173 with respect to the gate electrode 124.

According to an exemplary embodiment, the method of manufacturing a thin film transistor display panel may further include disposing the upper gate electrode 125 on the interlayer insulating layer 160.

Referring to FIG. 9A and FIG. 9B, the third contact hole 184 is formed in the second gate insulating layer 140b and the interlayer insulating layer 160 so as to expose the portion of the gate electrode 124. Next, the data line 171 including the source electrode 173 and the drain electrode 175 and the upper gate electrode 125 are formed by a photolithography process. The upper gate electrode 125 is made of the same material and formed in the same layer as the source electrode 173 and the drain electrode 175 by a mask process. The upper gate electrode 125 is electrically connected to the gate line 121 through the third contact hole 184.

Referring to FIG. 10, FIG. 11, FIG. 12 and FIG. 13, performance tests of the thin film transistor display panel according to an exemplary embodiment will be described.

FIG. 10, FIG. 11, FIG. 12 and FIG. 13 are graphs illustrating on-current characteristics corresponding to gate electrode voltages of a thin film transistor according to an exemplary embodiment.

Figure 10:
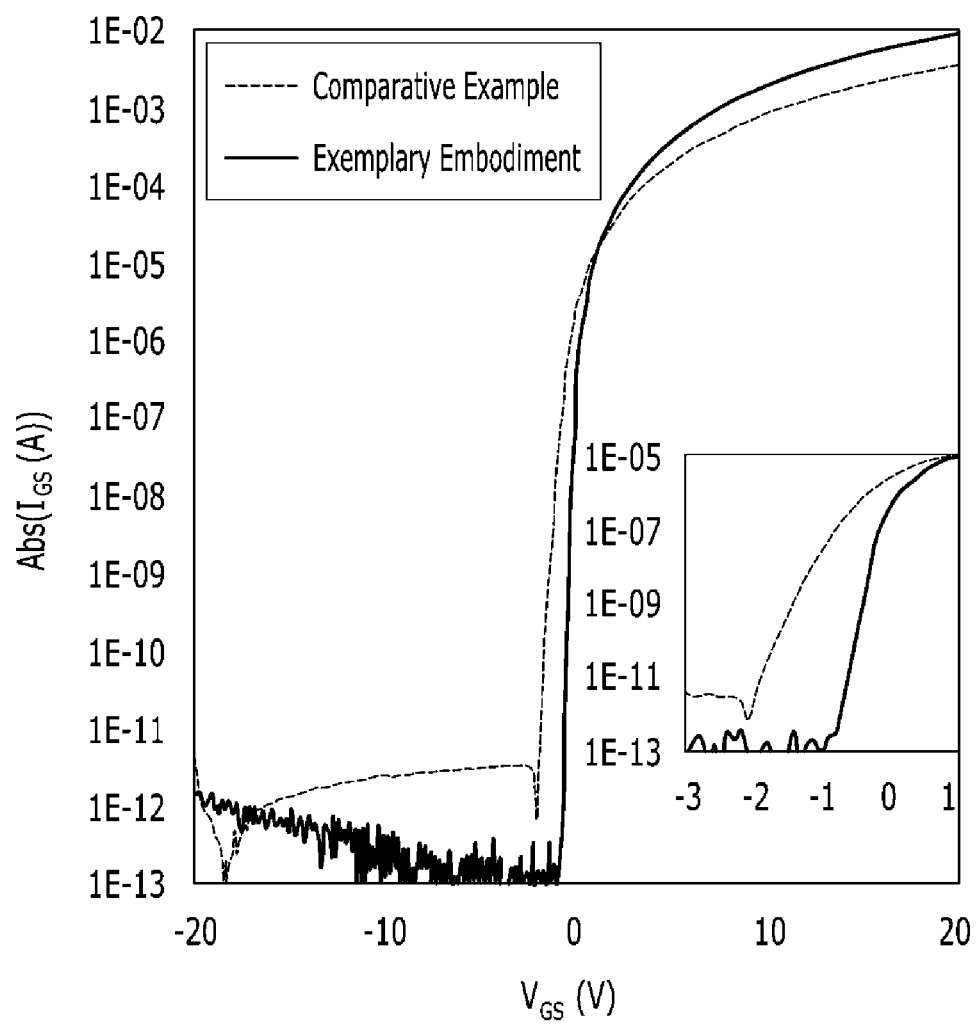
FIG. 10, FIG. 11, FIG. 12 and FIG. 13 are graphs illustrating on-current characteristics of a thin film transistor depending on gate electrode voltages of a thin film transistor according to an exemplary embodiment.
Figure 11:
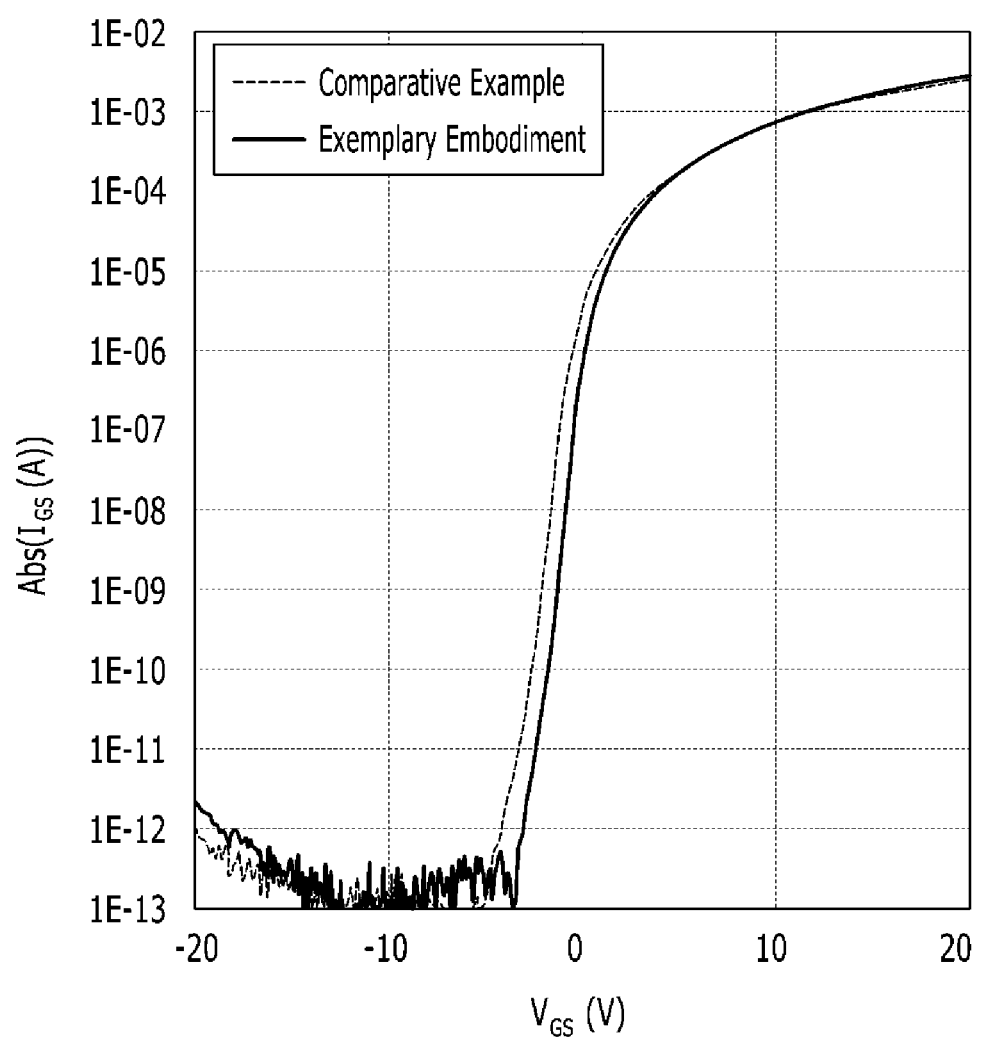

FIG. 10 shows the on-current characteristic corresponding to the gate electrode voltages of the thin film transistor according to the exemplary embodiment which includes two channel regions formed by a gate electrode, and the on-current characteristic corresponding to the gate electrode voltages of a thin film transistor according to a comparative example which includes one channel region formed by a bottom gate electrode. FIG. 11 illustrates the on-current characteristic corresponding to the gate electrode voltages of the thin film transistor according to the exemplary embodiment which includes two channel regions formed by a gate electrode, and the on-current characteristic corresponding to the gate electrode voltages of a thin film transistor according to the comparative example which includes one channel region formed by a top gate electrode.

Referring to FIG. 10 and FIG. 11, a slope of the source-drain current (lgs) corresponding to the gate electrode voltages (Vgs) of the thin film transistor according to the exemplary embodiment of the present invention is steeper than that of the thin film transistor according to the comparative example. It shows that on/off status of the source-drain current (lgs) corresponding to the gate electrode voltages (Vgs) of the thin film transistor in the exemplary embodiment of the present invention may be more clearly distinguished based on a threshold voltage (Vth) than that of the thin film transistor in the comparative example. Furthermore, the thin film transistor according to the exemplary embodiment of the present invention has a higher on-current than the thin film transistor in the comparative example. Accordingly, the thin film transistor according to the exemplary embodiment of the present invention may show an improved switching performance.

Figure 12:
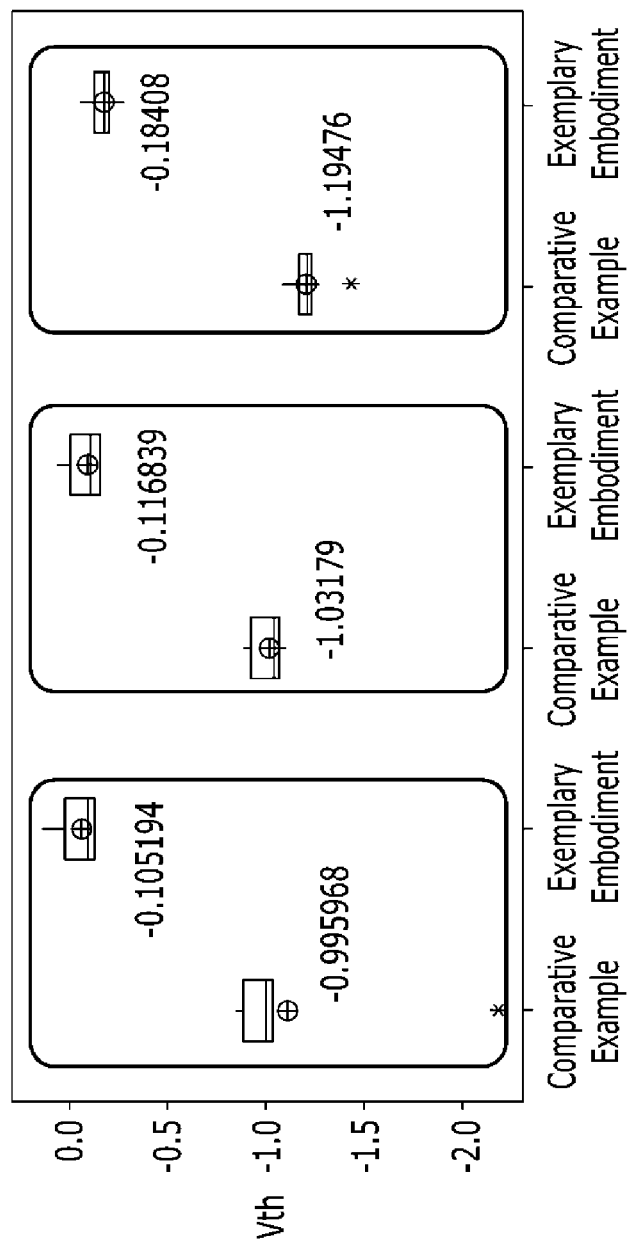

Referring to FIG. 12, the threshold voltage of the thin film transistor display panel according to the exemplary embodiment which includes two channel regions formed by one gate electrode is shifted about +1V compared to that of a thin film transistor according to the comparative example which includes one channel region formed by one gate electrode, thereby reducing the power consumption.

Figure 13:
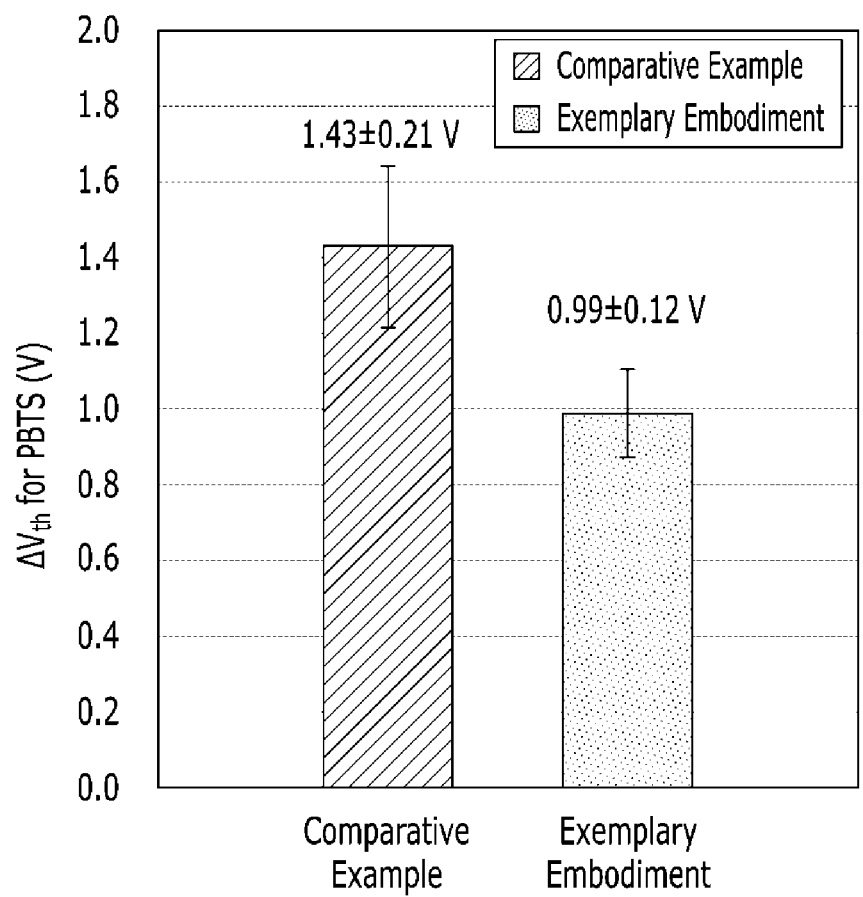

Referring to FIG. 13, an amount of threshold voltage (Vth) change in accordance with positive bias temperature stress (PBTS) of the thin film transistor display panel according to the exemplary embodiment which includes two channel regions formed by one gate electrode is smaller than that of the thin film transistor according to the comparative example which includes one channel region formed by one gate electrode. Accordingly, it is confirmed that a reliability of the thin film transistor according to an exemplary embodiment is improved compared to the thin film transistor according to the comparative example.

According to the exemplary embodiments, the characteristics of the thin film transistor may be improved by including two channel regions, one in the first semiconductor and the other in the second semiconductor, formed by a gate signal which is applied to the gate electrode, compared to the thin film transistor display panel according to the comparative example which includes only one channel region.

Although the above embodiments are described with respect to the thin film transistor display panel in the liquid crystal display, the exemplary embodiments are not limited thereto, and the thin film transistor display panels of the exemplary embodiments may be applied to other display devices.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A thin film transistor display panel comprising:
   a first insulating substrate;
   a first semiconductor disposed between the first insulating substrate and a first gate insulating layer;
   a gate electrode disposed on the first gate insulating layer, the gate electrode overlapping the first semiconductor;
   a second gate insulating layer disposed on the gate electrode;
   a second semiconductor disposed on the second gate insulating layer, the second semiconductor overlapping the gate electrode;
   an interlayer insulating layer disposed on the second semiconductor; and
   a source electrode and a drain electrode disposed on the interlayer insulating layer spaced apart from each other, the source electrode and the drain electrode connected to the first semiconductor and the second semiconductor.

2. The thin film transistor display panel of claim 1, wherein:
   each of the first gate insulating layer, the second gate insulating layer, the second semiconductor, and the interlayer insulating layer comprises a first contact hole and a second contact hole.

3. The thin film transistor display panel of claim 2, wherein:
   the source electrode is electrically connected to the first semiconductor and the second semiconductor through the first contact hole,
   the drain electrode is electrically connected to the first semiconductor and the second semiconductor through the second contact hole.

4. The thin film transistor display panel of claim 1, wherein:
   each of the first semiconductor and the second semiconductor comprises oxide semiconductors.

5. The thin film transistor display panel of claim 1, wherein:
   two channel regions are respectively formed in the first semiconductor and the second semiconductor in response to a gate signal applied to the gate electrode.

6. The thin film transistor display panel of claim 1, further comprising:
   an upper gate electrode disposed on the interlayer insulating layer.

7. The thin film transistor display panel of claim 6, wherein:
   the upper gate electrode is made of a same material as the source electrode and the drain electrode, and disposed in a same layer as the source electrode and the drain electrode.

8. The thin film transistor display panel of claim 6, wherein:
   three channel regions are respectively formed in the first semiconductor and the second semiconductor by a gate signal applied to the gate electrode and the upper gate electrode.

9. The thin film transistor display panel of claim 6, wherein:
   each of the second gate insulating layer and the interlayer insulating layer comprises a third contact hole.

10. The thin film transistor display panel of claim 9, wherein:
    the gate electrode and the upper gate electrode are electrically connected through the third contact hole.

* * * * *